United States Patent [19]
Woo

[11] Patent Number: 5,102,814
[45] Date of Patent: Apr. 7, 1992

[54] METHOD FOR IMPROVING DEVICE SCALABILITY OF BURIED BIT LINE FLASH EPROM DEVICES HAVING SHORT REOXIDATION BEAKS AND SHALLOWER JUNCTIONS

[75] Inventor: Been-Jon Woo, Saratoga, Calif.

[73] Assignee: Intel Corporation, Santa Clara, Calif.

[21] Appl. No.: 609,192

[22] Filed: Nov. 2, 1990

[51] Int. Cl.$^5$ .................. H01L 21/76; H01L 21/265
[52] U.S. Cl. ...................................... 437/43; 437/49; 437/69; 437/950
[58] Field of Search ............... 437/43, 49, 52, 195, 437/69, 70, 950; 148/DIG. 144

[56] References Cited

U.S. PATENT DOCUMENTS

| | | | |
|---|---|---|---|
| 3,996,657 | 12/1976 | Simko et al. | 437/43 |
| 4,114,255 | 9/1978 | Salsbury et al. | 437/43 |
| 4,407,696 | 10/1983 | Han et al. | 437/69 |
| 4,541,167 | 9/1985 | Havemann et al. | 437/70 |
| 4,780,424 | 10/1988 | Holler et al. | 437/43 |
| 4,804,637 | 2/1989 | Smayling et al. | 437/43 |
| 4,897,364 | 1/1990 | Nguyen et al. | 437/69 |
| 4,957,877 | 9/1990 | Tam et al. | 437/43 |
| 4,964,080 | 10/1990 | Tzeng | 357/23.5 |
| 5,002,898 | 3/1991 | Fritzinger et al. | 437/69 |

OTHER PUBLICATIONS

Han, Y-P. et al., "Isolation Process Using Polysilicon Buffer Layer for Scaled MOS/VLSI", Abstract No. 67, Journal of the Elect. Society, p. 98, 1984.

Primary Examiner—Brian E. Hearn
Assistant Examiner—C. Chaudhari
Attorney, Agent, or Firm—Blakely, Sokoloff, Taylor & Zafman

[57] ABSTRACT

A process for fabricating contactless electrically programmable and electrically erasable memory cells of the flash EPROM type. The cells use elongated source and drain regions disposed beneath field oxide regions. A high quality tunnel oxide is grown on the channel regions of the device, followed by deposition of a polysilicon buffer layer. The use of the polysilicon buffer layer results in short reoxidation beaks. The field oxide is grown in a short, low temperature wet oxidation step, enhanced by the presence of heavy dopant implants. The use of a short, low temperatue oxide growth allows the use of thin nitride masking members and results in short reoxidation beaks as well as less stress on the substrate during field oxide growth. Also, since a low temperature field oxidation is used, the quality of the tunnel oxide will be maintained. The thin nitride masking members are removed in a wet etch process which does not degrade the underlying polysilicon buffer layer. Therefore, the polysilicon buffer layer does not need to be removed and remains as part of the device. Since the polysilicon buffer layer is not removed, there is no damage to the underlying tunnel oxide, and this layer remains on the device as well. Because these layers remain after field oxide growth, there is no tunnel oxide growth subsequent to the field oxide growth as with prior art processes. Therefore, the reoxidation beak does not continue to grow during tunnel oxide growth as occurs with prior art processes where the tunnel oxide is grown after field oxide growth. Also, the dopant implanted regions are subjected to fewer thermal cycles than in prior art processes, resulting in shallower junctions. In addition, since the tunnel oxide is grown before the implantation of dopants, the quality of this layer is better than conventional tunnel oxides grown in the presence of dopant. The short reoxidation beak, reduced thermal cycles and better tunnel oxide quality of the present invention results in a greater effective channel length at a given drawn dimension, allowing for improved scaling and increased device density.

25 Claims, 3 Drawing Sheets

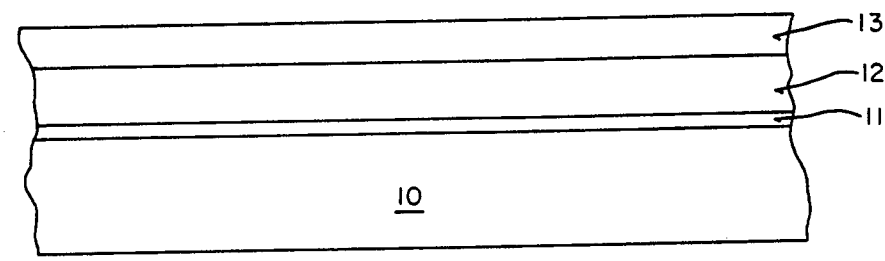
FIG_1
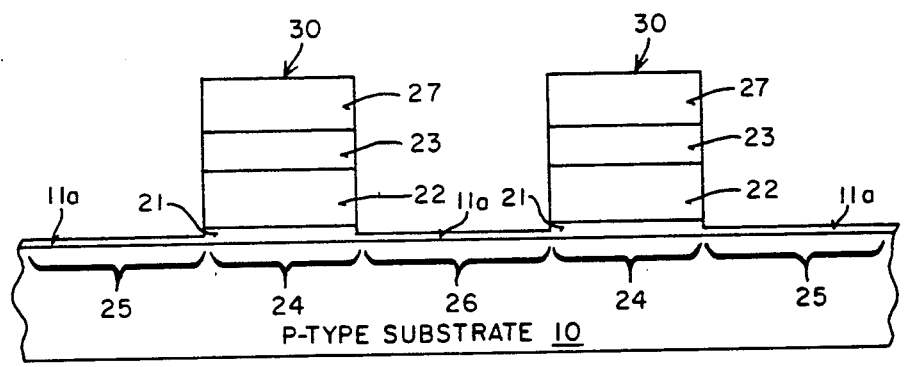
FIG_2
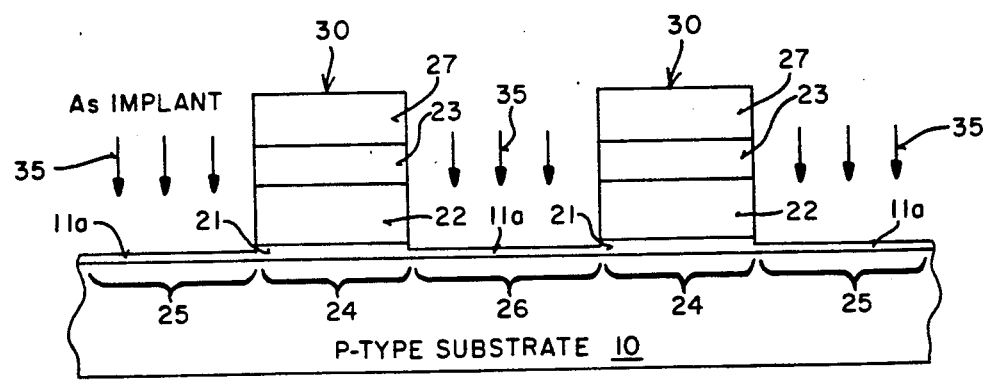
FIG_3

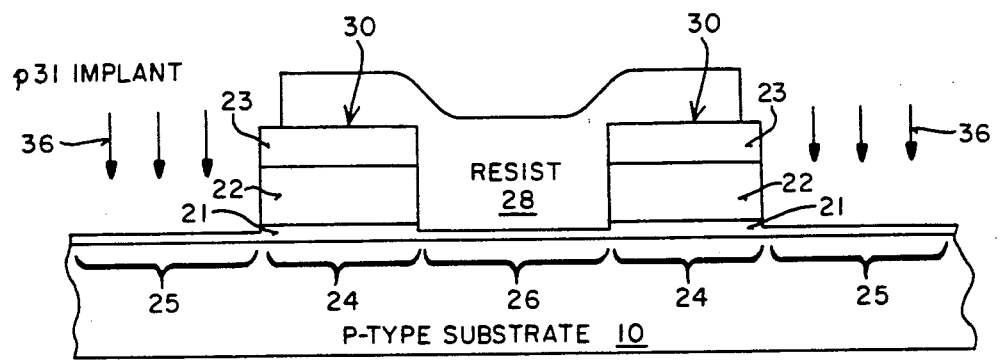
FIG_4
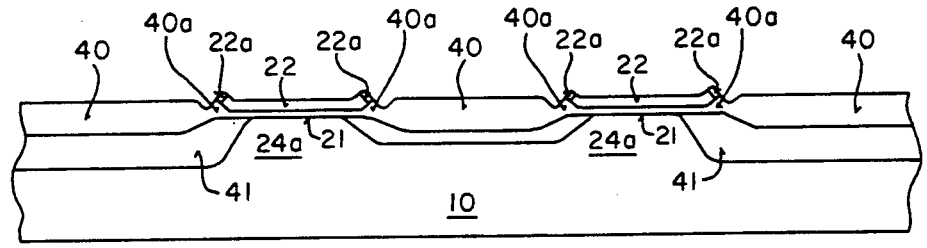
FIG_5
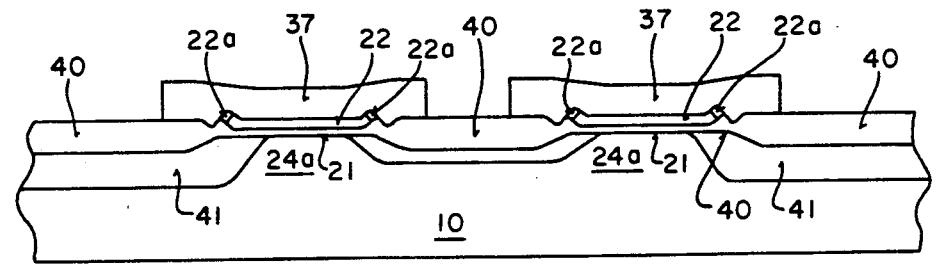
FIG_6

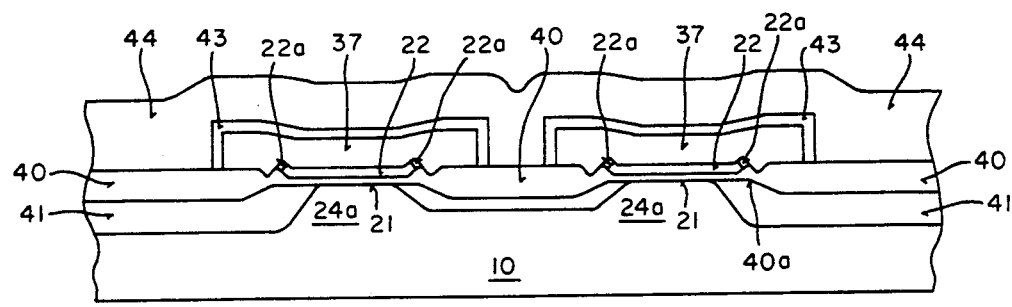
FIG_7
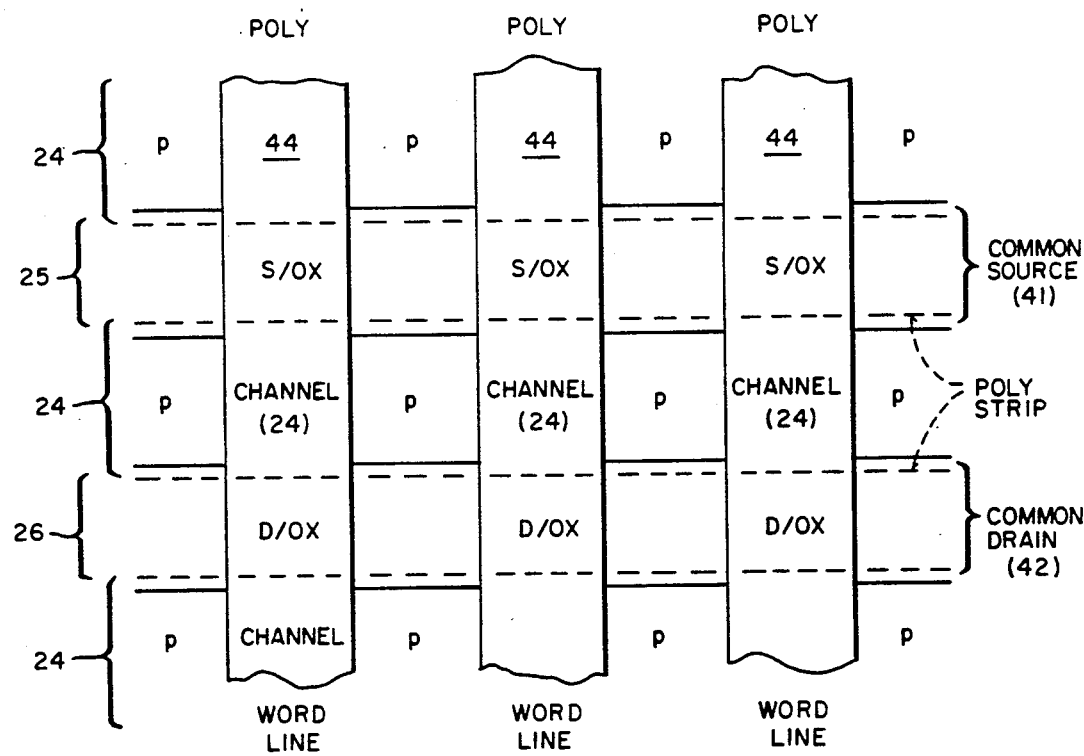
FIG_8

METHOD FOR IMPROVING DEVICE SCALABILITY OF BURIED BIT LINE FLASH EPROM DEVICES HAVING SHORT REOXIDATION BEAKS AND SHALLOWER JUNCTIONS

BACKGROUND OF THE PRESENT INVENTION

1. Field of the Invention

The invention relates to the field of semiconductor memory devices employing floating gates and the processes and methods for fabricating these devices.

2. Prior Art

One class of non-volatile semiconductor memories employs floating gates, that is, gates which are completely surrounded by an insulative layer such as silicon dioxide. Typically, a polycrystalline silicon (polysilicon) layer is used to form floating gates. These gates are electrically charged, most often with electrons by transferring charge into and from the gates through a variety of mechanisms. The presence or absence of this charge represents stored, binary information. An early example of such a device is shown in U.S. Pat. No. 3,500,142.

The earliest commercial electrically programmable read-only memories (EPROMs) employing floating gates used p-channel devices which are programmed through avalanche injection. Charge is removed from these devices by exposing the array to electromagnetic radiation such as ultraviolet light (see U.S. Pat. No. 3,660,819). Later, EPROMs used n-channel devices and relied on channel injection as the mechanism for transferring charge into the floating gates (see U.S. Pat. No. 3,984,822). Many EPROMs fabricated with current technology still rely on channel injection for transferring charge into the floating gates and radiation for erasing the gates.

Another category of semiconductor floating gate memory devices are both electrically programmable and electrically erasable. Such a device is shown in U.S. Pat. No. 4,203,158. Tunneling through a thin oxide region transfers charge into and from the floating gates. In these memories, two devices are required for each memory cell. One device includes the floating gate and the other (typically an ordinary field-effect transistor) is used to isolate the floating gate device during various memory cycles.

A more recent category of floating gate memory devices uses channel injection for charging floating gates and tunneling for removing charge from the gates. Here, each memory cell comprises only a single device and the entire memory array is erased at one time, that is, individual cells or groups of cells are not separately erasable as in current EEPROMs. These memories are sometimes referred to as "flash" EPROMs or EEPROMs.

In some cases, the floating gate memory devices are fabricated in arrays where each device or device pair is separated from other devices by field oxide regions. An example of this is shown in U.S. Pat. No. 4,114,255. In these arrays, a metal contact is needed for each device or device pair. These metal contacts take up substantial substrate area and therefore limit the reduction of device area. Another problem associated with fabricating cells of the type described in the above-mentioned patent is undesirable rounding of the edges of the common source. This rounding increases the floating gate to source tunneling area and therefore the floating gate to source capacitance. Increased tunnel area capacitance degrades the tunnel erase process. Additionally, there is always some misalignment of the polysilicon word line relative to the common source region. Since one dimension of the floating gate is defined in alignment with the word line, the total floating gate to source tunneling area will vary because of the word line misalignment. And, in fact, for each cell pair, due to the mirrored nature of the array, asymmetry will exist between the floating gate-to-source tunneling area for each pair. This causes a bi-modal distribution of the erase threshold. Obviously, it is undesirable to have a wide erase threshold distribution.

U.S. Pat. No. 4,780,424 provides a process for fabricating a buried bit line device which avoids the increased capacitance of the prior art cells. This process includes fabricating contactless electrically programmable and electrically erasable memory cells. Elongated source and drain regions are formed, and then field oxide is grown on top of the source and drain regions. The drain regions are shallow compared to the source regions. Furthermore, the source regions have more graded junctions. The floating gates are formed over a tunnel oxide between the source and drain regions with word lines being disposed perpendicular to the source and drain regions. One dimension of the floating gate is formed simultaneously and in alignment with the word lines.

The programming and erasing function of the memory cells occur near the region where the tunnel oxide and field oxide meet, known as the reoxidation beak. The formation of the beak occurs during field oxide growth with additional growth of the beak occurring during the subsequent tunnel oxide growth in prior art processes. The presence of the beak causes the tunnel oxide in the source and drain regions to be thicker than in regions removed from the beak. This thickening near the source region can cause alterations to the erase characteristics of the cell. If the tunnel oxide is too thick, tunneling from the floating gate to source during erase is impeded and the erase times are thereby increased.

In addition to affecting erase characteristics, the shape and thickness of the reoxidation beak has important consequences on device scaling. If the beak is too long, the source and drain regions must extend far enough beyond the beak to allow tunneling during erase and injection during programming, respectively. The channel drawn dimension must therefore have a long enough length to allow for the source and drain to extend beyond the beaks without shorting together. This extra channel length requirement limits the scaling down of drawn dimensions, thereby limiting device density.

What is needed is a process which forms short, well defined reoxidation beaks, thereby improving the erase characteristics and allowing for device scaling.

SUMMARY OF THE INVENTION

A process for fabricating electrically programmable and electrically erasable floating gate memory devices is described. The floating gates formed by the process of the present invention have short, well defined reoxidation beaks and shallow junctions.

First, a high quality tunnel oxide of approximately 110 Å is grown over what will be the channel regions of the devices. Next, approximately 500 Å of polysilicon is deposited on the tunnel oxide, followed by approximately 200-600 Å of silicon nitride deposited on the polysilicon. The two layers are then patterned into elongated, spaced apart, parallel strips. Because the nitride and polysilicon layers are so thin, no extensive overetch is required to ensure complete removal of these layers from unmasked regions of the substrate. Therefore, it is not difficult to completely remove these layers while leaving an oxide in the unmasked regions between the strips. In the regions between the strips, approximately 50-80 Å of the tunnel oxide layer remains unetched. The polysilicon layer serves as a buffer layer during a later field oxide growth, resulting in short reoxidation beaks.

Following patterning into strips, the substrate regions between the strips are doped with a heavy arsenic dose. Next alternate ones of the regions between the strips are covered and the others are doped with phosphorous. Next the field oxide referred to above is grown in a wet oxidation process at low temperature (800°-900° C.) for a short period of time. The growth of the field oxide is enhanced by the presence of the heavily implanted dopant. Since a short, low temperature oxidation step is used, the relatively thin nitride layer described above, together with the polysilicon buffer layer described above, can be used as masking members during the field oxidation step. Because only 1500-2000 Å of field oxide is needed and the growth of the field oxide is dopant enhanced, the field oxide growth can be carried out in short, low temperature wet oxidation step, resulting in a short reoxidation beak. This field oxidation can also be achieved by a short, high pressure dry oxidation.

Following the field oxide growth the thin nitride layer is removed in a short, hot phosphoric acid etch. Because the removal of the thin nitride layer does not degrade the underlying polysilicon buffer layer, the polysilicon buffer layer remains as part of the floating gates. Another polysilicon layer of approximately 1500 Å is deposited on the polysilicon buffer layer. Together the two polysilicon layers make up the floating gates of the memory devices.

The tunnel oxide of the present invention is grown early in the process and remains protected by the polysilicon buffer layer. Also, since the polysilicon buffer layer remains on the substrate, there is no degradation of the tunnel oxide because of the polysilicon removal step used in prior art processes. Therefore, there is no tunnel oxide growth step following field oxide growth as is done in the prior art processes, and this will also result in a smaller reoxidation beak. During the field oxide growth the source and drain regions are formed underneath the field oxide.

Next an insulative layer is deposited followed by the deposition of a third polysilicon layer which will be the control gates of the devices. This third polysilicon layer is patterned into elongated spaced apart strips perpendicular to the source and drain regions and disposed on top of the floating gates. During the etch of the control gates the second dimension of the floating gates is etched and thus the floating gates are formed during this step.

BRIEF DESCRIPTION OF THE DRAWINGS

FIG. 1 is a cross sectional elevation view of a semiconductor substrate with an oxide layer, a polysilicon layer and a silicon nitride layer formed thereon.

FIG. 2 is a cross sectional elevation view of the semiconductor body of FIG. 1 after patterning of the oxide, polysilicon and silicon nitride layers into strips.

FIG. 3 is a cross sectional elevation view of the semiconductor body of FIG. 2 during arsenic implantation into the regions between the strips.

FIG. 4 is a cross sectional elevation view of the semiconductor body of FIG. 3 during phosphorous implantation into alternate ones of the regions between the strips.

FIG. 5 is the semiconductor substrate of FIG. 4 after field oxide growth and removal of the nitride strips.

FIG. 6 is the semiconductor substrate of FIG. 5 after deposition and patterning of a second polysilicon layer to form floating gate members.

FIG. 7 shows two memory cells of the present invention on the semiconductor substrate of FIG. 6 after inter-poly dielectric formation and deposition and patterning of the polysilicon word lines.

FIG. 8 is a plan view of a portion of an array fabricated in accordance with the present invention.

DETAILED DESCRIPTION OF THE PRESENT INVENTION

A process for fabricating electrically programmable and electrically erasable floating gate memory devices is described. In the following description, numerous specific details are set forth such as specific doping levels, etc., in order to provide a thorough understanding of the present invention. It will be obvious, however, to one skilled in the art that these specific details need not be employed to practice the present invention. In other instances, well-known processing steps are not described in detail in order not to obscure unnecessarily the present invention.

The memory cells of the present invention are fabricated using standard metal-oxide-semiconductor (MOS) processing. The array which contains the cells, in the currently preferred embodiment is fabricated of n-channel devices on a p-type substrate. The peripheral circuits can employ either n-channel devices or complementary MOS (CMOS) devices. However, the present invention can also be used to fabricate an array of p-channel devices on an n-type substrate, with the peripheral circuits employing either p-channel or CMOS devices.

Initially, the entire substrate is covered with a thin silicon dioxide ($SiO_2$) layer followed by a thicker silicon nitride ($Si_3N_4$) layer. The silicon nitride layer is patterned as needed for the peripheral circuits and, following a boron implant, field oxide regions are grown for the peripheral circuits. The array fabricated by the present invention remains protected by the silicon nitride layer during the field isolation processing (the "front end" of the process flow) of the peripheral circuits.

After completion of the front end isolation processing of the peripheral circuits, the oxide and nitride in the array region referred to above are removed using conventional techniques. A sacrificial oxide is then grown and $B^{11}$ implants are performed to adjust the threshold voltage and punchthrough voltage of the memory devices. Next the sacrificial oxide is removed in the array region to clean up the surface of the semiconductor substrate in order to grow a high quality tunnel oxide. The tunnel oxide is also known as a "channel oxide."

In the following description and Figures it will be understood that only a small portion of the semiconductor substrate is described or shown. Further, while FIGS. 1-7 show the fabrication of an array in accordance with the present invention in reference to two memory devices or "cells" sharing a common drain, it will be understood that there are many alternating common sources and common drains running in parallel in an array. In addition, it will be understood that there are many such cells formed along each parallel common source and common drain pair.

Referring to FIG. 1, a portion of the array region of p-type monocrystalline silicon substrate 10 is shown with tunnel oxide 11, thin polysilicon layer 12 and nitride layer 13. In the currently preferred embodiment, tunnel oxide 11 is silicon dioxide ($SiO_2$) grown in a conventional furnace at approximately 920° C. to a thickness of approximately 100–110 Å. Also in the currently preferred embodiment, polysilicon layer 12 is polycrystalline silicon (Si) deposited to a thickness of approximately 300–600 Å, and nitride layer 13 is silicon nitride ($Si_3N_4$) deposited to a thickness of approximately 200–600 Å. These layers are formed using conventional techniques.

Next, the structure of FIG. 1 is masked and etched to remove layers 13 and 12 and a portion of layer 11 from unmasked regions using conventional plasma etch techniques. Nitride layer 13 is etched using, for example, a carbon hexafluoride ($C_2F_6$) plasma or a sulfur hexafluoride ($SF_6$) plasma and polysilicon layer 12 is etched using, for example, a chlorine ($Cl_2$) plasma. After the etching of layers 12 and 13 as described above, approximately 30–60 Å of tunnel oxide 11 will be etched from the unmasked regions of substrate 10.

As will be discussed below, many prior art processes utilize a much thicker nitride layer than nitride layer 13 of the present invention for use as a masking member during field oxide growth. To ensure that the unmasked portions of the thick nitride layer of the prior art are completely etched during the etching process, a relatively long overetch must be employed. However, because the selectivity of the plasma etch of nitride over polysilicon is not that good, a significant portion of the underlying polysilicon layer will be etched during the nitride overetch in some regions of the substrate. Therefore, during the prior art polysilicon buffer layer etch, in the regions where significant polysilicon has been etched during the nitride etch, the underlying oxide layer will be etched away or severely degraded.

In the present invention, because the nitride layer 13 and polysilicon layer 12 are so thin, no extensive overetch is required to ensure complete removal of these layers. Therefore, it is not difficult to completely remove these layers while leaving an oxide in the regions between the strips. The resulting structure is shown in FIG. 2. Over regions 24 of substrate 10, which will be the channel regions of the cells making up the array, is the patterned layer of tunnel oxide 21, thin polysilicon layer 22 and nitride layer 23 formed from layers 11, 12 and 13, respectively, of FIG. 1. These patterned layers form elongated, parallel, spaced-apart strips 30 over regions 24. The elongated spaced-apart strips 30 (which overlie what will become the channel regions of the cells) define elongated, spaced-apart substrate regions between these strips. Alternate ones of the regions between the strips 30 are shown as regions 25 and 26 of FIG. 2. In the regions between the strips, the tunnel oxide layer 11 is not completely etched, but approximately 50–80 Å of $SiO_2$ remain, shown as layer 11a in FIG. 2. Regions 25 will become the common source regions and regions 26 will become the common drain regions of the memory cells.

Referring now to FIG. 3, the first of two n-type doping steps is shown. The regions 24 underlying the strips 30 and photoresist members 27 are protected when the regions 25 and 26 between the strips 30 are implanted with arsenic as indicated by the arrows 35. In the presently preferred embodiment, arsenic is implanted to a level of $1 \times 10^{15}/cm^2$ to $5 \times 10^{15}/cm^2$. This forms elongated, parallel, spaced-apart doped regions in the substrate. After the arsenic is implanted, photoresist members 27 are removed.

Next, as illustrated in FIG. 4, alternate ones of the elongated regions between the strips 30 (such as regions 26) are covered with a photoresist members 28. The regions 26 are thus protected by photoresist members 28 while the regions 24 remain protected by the strips 30. The elongated regions 25 are exposed and are implanted with an n-type dopant. This step is indicated as arrows 36 in FIG. 4. The regions 25 in the currently preferred embodiment are doped with phosphorous to a level of approximately $0.2 \times 10^{15}/cm^2$ to $1.0 \times 10^{15}/cm^2$.

Next, a field oxide must be grown at regions 25 and 26. The field oxide must be thick enough to serve as an insulation layer between the buried bit lines (the common source regions and common drain regions formed from dopant implanted regions 25 and 26) and the subsequently formed word lines, discussed below in conjunction with FIG. 7. To be an effective insulative layer, the field oxide regions should be approximately 1000–2,500 Å thick. During field oxide growth, polysilicon layer 22 will serve as a buffer between the tunnel oxide 21 and nitride layer 23. During the field oxide growth the presence of the polysilicon layer 22 will supply silicon to react with the oxygen, thereby preventing excessive oxygen diffusion through the tunnel regions near the edges of strips 30. As a result, less oxygen will be available to react with the silicon in the tunnel regions and shorter beaks will be formed. Furthermore, the polysilicon layer 22 serves as a stress release layer during field oxidation, so that the beak quality (the edge of the field oxide) will be better.

In many prior art devices, the field oxide is grown simultaneously with the field oxide of the peripheral circuits, which must be approximately 6000 Å thick. To grow an oxide this thick requires nitride members of much greater thickness than those used in the present invention to mask the regions 24 without lifting, consuming or cracking the nitride members during oxide growth. The thick nitride members are necessary to apply sufficient downward pressure to prevent oxide growth at the regions 24 during field oxide growth in order to form small beak size. Usually in the prior art, the field oxide is grown in a wet oxidation step which requires approximately 6–10 hours at 920° C. Such a long and high temperature oxidation step is necessary because the dopant enhanced oxidation is lacking. The nitride member must be thick enough to withstand these conditions for this duration of time. Such a long, high temperature oxidation step results in a long reoxidation beak.

In the present invention, the need for a long, high temperature step is overcome in several ways. First, in the present invention, the field oxide in the array in not grown simultaneously with the field oxide of the peripheral circuits. Therefore, the field oxide of the array need only be thick enough to prevent bit line to word line shorting. In the present invention, the field oxide is grown to a thickness of approximately 1800 Å in the currently preferred embodiment. Next, the growth of the field oxide at regions 25 and 26 is performed after these regions have been implanted by dopants. As it is well known that oxide growth is enhanced by the presence of dopants, the oxide therefore grows faster in these regions than for a corresponding thickness of oxide growth in undoped silicon. As a result, the wet oxidation step of the present invention is carried out at a temperature of approximately 850° C. for a time of approximately 5 minutes in the currently preferred embodiment. The use of this short, low temperature oxidation step results in very short reoxidation beaks. In an alternative embodiment, a short, high pressure oxidation step may be employed. In the currently preferred alternative embodiment, the high pressure oxidation step is carried out in $O_2$ at a pressure of approximately 20 Atm, a temperature of approximately 875° C. for a time of approximately 20 minutes.

Referring to FIG. 5, this oxidation step results in the field oxide regions 40. In the currently preferred embodiment, the thickness of field oxide regions 40 is approximately 1800 Å. Note the strips 30 prevent the formation of oxide in the regions 24 which have become somewhat shortened by the reoxidation beak 40a of field oxide 40 and the lateral diffusion of dopants from regions 25 and 26. The regions without field oxide are the channels of the cells and are now indicated as regions 24a. The oxidation step activates the arsenic and phosphorus dopants forming the source regions 41 (at the regions 25) and drain regions 42 (at regions 26). Note, as shown in FIG. 5, the source regions 41 are deeper than the drain regions 42. The phosphorus dopant diffuses more quickly into the silicon than arsenic, thus making these regions deeper. Moreover, the dopant gradient associated with the source regions are more gradual (graded) than that associated with the drain regions.

Because the oxide growth is performed in a wet oxidation step and is dopant enhanced, and because the oxide only needs to be thick enough to isolate the buried bit lines from the word lines, a short, low temperature oxidation step can be utilized for the field oxidation. The use of a short length and low temperature oxidation step in a poly-buffer process results in a shorter reoxidation beak 40a of FIG. 5. The short, low temperature oxidation step also results in shallower junctions. In addition, a long, high temperature oxidation step can adversely affect the integrity of the tunnel oxide 21. In the present invention, the integrity of the tunnel oxide 21 is maintained since the field oxidation step is performed at a relatively low temperature for a short time.

In conventional poly-buffer isolation processes, the polysilicon buffer layer is removed after field oxide growth. Conventionally, dry plasma etching is used to remove this layer, and it is extremely difficult to remove 500 Å of polysilicon without pitting the underlying layers. Because of this, after the polysilicon buffer layer is removed, the oxide layer overlying the channel regions must also be removed after field oxide growth and a new high quality tunnel oxide layer must then be grown in prior art processes. This has several disadvantages. The growth of the tunnel oxide after the growth of the field oxide leads to increased beak length, as the reoxidation beak continues to grow during tunnel oxide growth. The additional beak growth during tunnel oxide growth is enhanced by the presence of dopants, which have diffused laterally during field oxide growth. Additionally, the dopants in the source regions 25 and drain regions 26 continue to diffuse laterally during tunnel oxide growth in the prior art, further contributing to the decrease in effective channel length, to be described below. Finally, the prior art method has the further disadvantage of increased processing steps.

In the present invention, after the growth of the field oxide 40, the nitride layer 23 is removed by placing the substrate 10 in hot phosphoric acid ($H_3PO_4$) for 10–20 minutes. This processing does not degrade the underlying polysilicon layer 22. Therefore, polysilicon layer 22 remains as part of the cells, so that no polysilicon removal step is required. The tunnel oxide degradation problems associated with the removal of the polysilicon layer in prior art polysilicon buffer isolation processes is therefore prevented, and the tunnel oxide 21 remains on the substrate as part of the cells. After removal of nitride layer 23, the substrate 10 can, optionally, be subjected to a short anneal (10 minutes in $N_2$ at 800° C.). The purpose of this anneal is to clean up the surface of polysilicon layer 22, and alternative methods can be employed to accomplish this purpose. In the present invention, because the silicon nitride can be completely removed without affecting the polysilicon layer 22 and tunnel oxide 21, these layers remain after field oxide growth, as shown in FIG. 5. Also as shown in FIG. 5, polysilicon layer 22 has some oxide growth on the edges, identified by numeral 22a.

Since in the present invention the tunnel oxide is grown before the As and P implants, the doped regions (that is source regions 25 and drain regions 26) are subjected to fewer thermal cycles compared to prior art processes where the tunnel oxide is grown after these implantations. This reduction in the number of thermal cycles to which the regions 25 and 26 are subjected results in shallower junctions. The final distance between the source regions 25 and the drain regions 26 is referred to as the effective length of the channel. For a given drawn length (i.e. mask dimension), the effective channel length of the present invention will be longer than that obtained in prior art processes because there is less lateral diffusion of dopants from the source regions 25 and drain regions 26 in the present invention. Thus, in the present invention the drawn dimension of channel regions 24 can be made smaller than the drawn dimension for these regions in a prior art process without causing source to drain shorting due to the decreased lateral diffusion in the present invention. This ability to use smaller channel regions 24 allows for the scaling down of the drawn dimensions of the device, thereby increasing device density. Also, because tunnel oxide layer 21 is already present before field oxide 40 growth in the present invention, there is no additional growth of the beak after field oxide growth due to tunnel oxide growth as occurs in prior art processes.

The reduction in lateral diffusion and the shorter reoxidation beak, which result from the use of a short, low temperature field oxidation step and from the growth of the tunnel oxide prior to the field oxidation step in the present invention, leads to an increased effective channel length for a given drawn dimension. Therefore, the drawn size of the channel can be decreased, with a corresponding increase in device density. Using the process of the present invention, a reduction of 0.2 microns in the drawn channel length dimension has been achieved.

An additional advantage of the present invention is that the quality of the tunnel oxide is improved compared with prior art processes where the tunnel oxide is grown after dopant implantation. This is because of the well known fact that oxides grown in the presence of dopant are of lesser quality than those grown in undoped silicon, as is the case with the tunnel oxide of the present invention.

Another additional advantage of the present invention is that because such a thin nitride layer 23 is used as a mask during field oxide growth, stress on the substrate is reduced. This reduction in stress reduces the number of dislocation or substrate defects.

After removal of the nitride layer 23, a second polysilicon layer is deposited on the structure of FIG. 5 using conventional techniques. In the currently preferred embodiment, the second polysilicon layer is deposited to a thickness of approximately 1000–1500 Å. Polysilicon layer 22 and the second polysilicon layer together will make up the floating gates. Therefore, in the currently preferred embodiment, the floating gate has a total polysilicon thickness of approximately 1500–2000 Å above the channel regions 24a. After deposition of the second polysilicon layer, it is masked and etched using conventional techniques in alignment with polysilicon layer 22, to form polysilicon layer 37 shown in FIG. 6. That is, it is patterned into elongated, spaced-apart parallel strips disposed over polysilicon layer 22. The floating gates will be formed from polysilicon layers 22 and 37 by etching them in alignment with the word lines as described below.

Now an inter-poly dielectric 43 is deposited over the structure of FIG. 6 to cover the polysilicon strips 37. In the currently preferred embodiment, inter-poly dielectric 43 is a multi-layer structure comprised of a first oxide layer, a silicon nitride layer and a second oxide layer (ONO). Following formation of inter-poly dielectric 43 a third layer of polysilicon is deposited on the substrate. This third polysilicon layer is etched to form elongated, parallel, spaced-apart polysilicon strips 44 which are generally perpendicular to the source regions 41 and drain regions 42. FIG. 7 shows inter-poly dielectric 43 (shown as a single layer for simplicity) and polysilicon strips 44. The polysilicon strips form the word lines (control gates) of the present memory devices. The elongated strips formed from polysilicon layers 22 and 37 are etched in alignment with the strips 44, thereby forming a plurality of floating gates. The resultant memory devices and the layout of the array is best seen in FIGS. 7 and 8. "S/OX" represents buried source regions and D/OX buried drain regions. As can be seen from FIG. 8, there are a plurality of cells formed along a parallel common source 41 and common drain 42 pair. For example, cells 1, 2 and 3 are formed along the common source 41 and common drain 42 shown. Also, at the top of FIG. 8 there is (not shown) another common drain 42 parallel to the common source 41 shown, from which the cells labeled 4, 5 and 6 are formed. Likewise, at the bottom of FIG. 8 there is (not shown) another common source 41 parallel to the common drain 42 shown, from which the cells labeled 7, 8 and 9 are formed. The two cells shown in FIG. 7 could be, for example, cells 1 and 7 of FIG. 8. The number of cells along each adjacent common source 41 and common drain 42 pair, as well as the total number of common source 41 and common drain 42 regions in an array will depend on the size of the memory array desired.

Metal layers and contacts are formed by well known methods to complete the memory.

The cells are programmed by applying a voltage to the drain regions 42 of 4–7 volts while the control gates (lines 44) are brought to a relatively high voltage (10–15 volts). To erase the floating gates, that is, to tunnel the charge from the floating gate to the source, a high voltage (10–15 volts) is applied to the source regions 41 while the drain regions 42 are floating and the control gates are grounded. For a more complete discussion of the erasing of such devices see U.S. Pat. No. 4,797,856.

As can be seen in FIG. 8, the array of electrically erasable and programmable cells includes the parallel source and drain regions 41 and 42. With the above-described processing, the drain regions are sharply defined (abrupt, shallow junctions), thereby providing good programming efficiency. In contrast, the source regions 41 are graded for improved junction breakdown. The source and drain region profiles are asymmetrical and optimized for their respective function. The field oxide is grown in a short, low temperature wet oxidation step, resulting in a short, well defined reoxidation beaks, as well as shallower junctions. Additionally, since the tunnel oxide is grown prior to field oxide growth, the reoxidation beaks are not further extended during tunnel oxide growth as occurs in prior art processing. Also, since the tunnel oxide is grown prior to dopant implantation, the doped regions are subjected to fewer thermal cycles, and there is less lateral diffusion of the dopants compared with prior art processes. The short reoxidation beaks and reduced lateral diffusion result in a greater effective channel length for a given drawn dimension, allowing for device scaling.

Thus, a one transistor floating gate electrically erasable and electrically programmable read-only memory cell with a short reoxidation beak allowing scaling of drawn size, and therefore increased device density, is described.

I claim:

1. A process for fabricating a floating gate memory device including an array area and a peripheral area comprising the steps of:

supplying a monocrystalline silicon substrate;

depositing a first silicon nitride layer over said substrate;

patterning said first silicon nitride layer to form an opening within said peripheral area while said array area remains covered with said silicon nitride layer;

forming a field isolation area within said opening;

removing said first silicon nitride layer;

forming elongated, spaced-apart, parallel first strips over first regions of said substrate within said array area, said first strips comprising a tunnel oxide layer disposed on said substrate, a first polysilicon layer disposed on said tunnel oxide layer and a second silicon nitride layer disposed on said first polysilicon layer, said second silicon nitride layer being thinner than said first silicon nitride layer, said first strips defining elongated, parallel, spaced-apart second regions of said substrate between said first strips;

doping said second regions of said substrate between said strips;

growing a field oxide at said second regions of said substrate;

removing said second silicon nitride from said first strips to form second strips over said first regions of said substrate comprising said tunnel oxide and said first polysilicon layer;

forming a second polysilicon layer over said second strips to form third strips over said first regions of said substrate comprising said tunnel oxide, said first polysilicon layer and said second polysilicon layer;

forming a plurality of first gate members from said third strips; and forming elongated second gate members from a third polysilicon layer, said second gate members being formed over said first gate members and being insulated from said first gate members, said second gate members being generally perpendicular to said first and second regions.

2. The process as defined in claim 1 wherein alternate ones of said second regions are doped with an n-type dopant to a first level of doping and the others of said second regions are doped with an n-type dopant to a second level of doping, said first level of doping being different from said second level of doping.

3. The process as defined in claim 1 wherein alternate ones of said second regions are doped with an n-type dopant to a first depth and the others of said second regions are doped with an n-type dopant to a second depth, said first depth being greater than said second depth.

4. The process as defined in claim 1 wherein said doping step comprises the steps of:

implanting an arsenic dopant into all of said second regions; and implanting a phosphorous dopant into alternate ones of said second regions.

5. The process as defined in claim 2 wherein said doping step comprises the steps of:

implanting an arsenic dopant into all of said second regions; and implanting a phosphorous dopant into alternate ones of said second regions.

6. The process as defined in claim 3 wherein said doping step comprises the steps of:

implanting an arsenic dopant into all of said second regions; and implanting a phosphorous dopant into alternate ones of said second regions.

7. The process as defined in claim 1 wherein said growth of said field oxide is performed after said doping step.

8. The process as defined in claim 2 wherein said growth of said field oxide is performed after said doping step.

9. The process as defined in claim 3 wherein said growth of said field oxide is performed after said doping step.

10. The process as defined in claim 4 wherein said growth of said field oxide is performed after said doping step.

11. The process as defined in claim 5 wherein said growth of said field oxide is performed after said doping step.

12. The process as defined in claim 6 wherein said growth of said field oxide is performed after said doping step.

13. The process as defined in one of claims 1-12 wherein said growth of said field oxide is carried out at a temperature of less than 920° C. for a time of less than 15 minutes in a wet oxidation process.

14. The process as defined in one of claims 1-12 wherein the thickness of said field oxide is in the range of 800-2500 Å.

15. The process as defined in claim 13 wherein the thickness of said field oxide is in the range of 800-2500 Å.

16. The process as defined in one of the claims 1-12 wherein the thickness of said first polysilicon layer is in the range of 200-700 Å and the thickness of said second silicon nitride layer is in the range of 200-600 Å.

17. The process as defined in one of claims 1-12 wherein the thickness of said tunnel oxide is in the range of 90-150 Å.

18. A process for fabricating a field-effect memory device including an array area and a peripheral area comprising the steps of:

supplying a monocrystalline silicon substrate;

depositing a first silicon nitride layer over said substrate;

patterning said first silicon nitride layer to form an opening within said peripheral area while said array area remains covered with said silicon nitride layer;

forming a field isolation area within said opening;

removing said first patterned silicon nitride layer;

forming a member over a first region of said substrate within said array area, said first member comprising said gate oxide layer disposed on said substrate, said first polysilicon layer disposed on said gate oxide layer and a second silicon nitride layer disposed on said first polysilicon layer, said second silicon nitride layer being thinner than said first silicon nitride layer, a second region being a region of said substrate within said memory array that is not covered by said member;

growing a field oxide layer at a second region of said substrate within said array;

removing said second silicon nitride from said first members to form second members over said first regions of said substrate comprising said gate oxide layer and said first polysilicon layer;

forming a second polysilicon layer over said second members to form third members over said first regions of said substrate comprising said gate oxide layer, said first polysilicon layer and said second polysilicon layer;

patterning said first polysilicon layer and said second polysilicon layer so that the patterned edges of both polysilicon layers are substantially coincident with one another to form a polysilicon line.

19. The process as defined in claim 18 wherein the thickness of said second silicon nitride layer is in the range of 200-600 Å.

20. The process as defined in claim 19 wherein the thickness of said first polysilicon layer is in the range of 200-700 Å.

21. The process as defined in claim 20 wherein the thickness of said second polysilicon layer is in the range of 1000-1500 Å.

22. The process as defined in claim 20 wherein said growth of said field oxide layer is carried out at a temperature of less than 920° C. for a time of less than 15 minutes in a wet oxidation process.

23. The process as defined in claim 22 wherein the thickness of said field oxide layer is in the range of 800-2500 Å.

24. The process as defined in claim 20 further comprising the step of:

after forming said first polysilicon line, selectively doping predetermined locations along said polysilicon line with a dopant thereby forming a source and a drain.

25. The process as defined in claim 24 wherein said dopant is a n-type dopant type and said monocrystalline silicon substrate is p-type doped.

* * * * *